United States Patent
Chen et al.

(10) Patent No.: US 12,191,197 B2
(45) Date of Patent: Jan. 7, 2025

(54) MANUFACTURING METHOD OF PACKAGE STRUCTURE OF ELECTRONIC DEVICE

(71) Applicant: Innolux Corporation, Miao-Li County (TW)

(72) Inventors: Ching-Wei Chen, Miao-Li County (TW); Yu-Jen Chang, Miao-Li County (TW); Tzu-Yen Chiu, Miao-Li County (TW); Hung-I Tseng, Miao-Li County (TW); Chuan-Ming Yeh, Miao-Li County (TW); Heng-Shen Yeh, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 447 days.

(21) Appl. No.: 17/747,940

(22) Filed: May 18, 2022

(65) Prior Publication Data
US 2023/0238278 A1    Jul. 27, 2023

(30) Foreign Application Priority Data

Jan. 21, 2022  (CN) .......................... 202210073807.2

(51) Int. Cl.
*H01L 21/00*    (2006.01)
*H01L 21/768*    (2006.01)
(Continued)

(52) U.S. Cl.
CPC .. *H01L 21/76826* (2013.01); *H01L 21/76816* (2013.01); *H01L 21/76873* (2013.01);
(Continued)

(58) Field of Classification Search
CPC ......... H01L 21/76826; H01L 21/76816; H01L 21/76873
See application file for complete search history.

(56) References Cited

U.S. PATENT DOCUMENTS 5,988,233 A * 11/1999 Fosnight ........... H01L 21/67376
                                            414/217
9,754,822 B1 * 9/2017 Chou ................... H01L 23/5226
(Continued)

FOREIGN PATENT DOCUMENTS

TW       I478281       3/2015
TW     201606872       2/2016
(Continued)

OTHER PUBLICATIONS

"Office Action of Taiwan Counterpart Application", issued on Nov. 29, 2022, p. 1-p. 8.

*Primary Examiner* — Laura M Menz
(74) *Attorney, Agent, or Firm* — JCIPRNET

(57) ABSTRACT

A manufacturing method of a package structure of an electronic device, including the following steps, is provided. A first seed layer is formed on a carrier plate. A first metal layer is formed on the first seed layer. A first insulating layer is formed on the first metal layer, wherein the first insulating layer exposes a portion of the first metal layer. A first plasma treatment is performed on the first insulating layer and the exposed portion of the first metal layer. After performing the first plasma treatment, the carrier plate formed with the first seed layer, the first metal layer, and the first insulating layer is placed in a microenvironment controlling box. After taking the carrier plate out of the microenvironment controlling box, a second seed layer is formed on the first insulating layer and the exposed portion of the first metal layer.

20 Claims, 3 Drawing Sheets

(51) Int. Cl.
*H01L 23/522* (2006.01)
*H01L 23/528* (2006.01)
*H01L 23/532* (2006.01)

(52) U.S. Cl.
CPC .... *H01L 21/76883* (2013.01); *H01L 23/5226* (2013.01); *H01L 23/5283* (2013.01); *H01L 23/53238* (2013.01)

(56) References Cited

U.S. PATENT DOCUMENTS

| | | | | |
|---|---|---|---|---|
| 10,256,144 | B2 * | 4/2019 | Ren | H01L 21/76834 |
| 10,727,119 | B2 * | 7/2020 | Ren | H01L 21/28562 |
| 2004/0168742 | A1 * | 9/2004 | Kim | H01L 21/67017 |
| | | | | 141/98 |
| 2008/0044595 | A1 * | 2/2008 | Thakur | H01L 21/67184 |
| | | | | 427/570 |
| 2010/0227473 | A1 * | 9/2010 | Matsuda | H01L 21/76831 |
| | | | | 438/653 |
| 2017/0015548 | A1 * | 1/2017 | Mao | B81C 1/00333 |
| 2018/0315650 | A1 * | 11/2018 | Ren | H01L 23/5226 |
| 2019/0093219 | A1 * | 3/2019 | Hayashi | H01L 21/67778 |
| 2019/0157145 | A1 * | 5/2019 | Ren | H01L 21/76826 |
| 2020/0335395 | A1 * | 10/2020 | Xu | H01L 21/76816 |
| 2023/0238252 | A1 * | 7/2023 | Wang | H01L 21/6835 |
| | | | | 438/127 |
| 2023/0238278 | A1 * | 7/2023 | Chen | H01L 21/4857 |
| | | | | 438/622 |
| 2023/0320223 | A1 * | 10/2023 | Sangle | H10N 30/076 |
| | | | | 310/311 |
| 2023/0345836 | A1 * | 10/2023 | Gao | H10N 30/853 |
| 2023/0411456 | A1 * | 12/2023 | More | H01L 29/0665 |
| 2024/0052480 | A1 * | 2/2024 | Gelatos | C23C 16/14 |
| 2024/0243028 | A1 * | 7/2024 | Tsai | H01L 24/13 |

FOREIGN PATENT DOCUMENTS

| | | | | |
|---|---|---|---|---|
| TW | I690000 | | 4/2020 | |
| TW | 202331856 A | * | 8/2023 | |
| TW | 202411449 A | * | 3/2024 | ............. C23C 16/04 |
| TW | 202428171 A | * | 7/2024 | ......... H01L 41/0815 |
| WO | WO-9811598 A1 | * | 3/1998 | ....... H01L 21/67017 |
| WO | WO-9950145 A1 | * | 10/1999 | ....... H01L 21/67376 |
| WO | WO-2007011666 A2 | * | 1/2007 | ............. H01L 21/67 |
| WO | WO-2022040869 A1 | * | 3/2022 | ............ H10N 30/057 |
| WO | WO-2022151472 A1 | * | 7/2022 | ............. C04B 35/493 |
| WO | WO-2023201615 A1 | * | 10/2023 | ......... H01L 41/0815 |

* cited by examiner

MANUFACTURING METHOD OF PACKAGE STRUCTURE OF ELECTRONIC DEVICE

CROSS-REFERENCE TO RELATED APPLICATION

This application claims the priority benefit of China application serial no. 202210073807.2, filed on Jan. 21, 2022. The entirety of the above-mentioned patent application is hereby incorporated by reference herein and made a part of this specification.

BACKGROUND

Technical Field

The disclosure relates to a manufacturing method of a package structure, and more particularly to a manufacturing method of a package structure of an electronic device.

Description of Related Art

During the process of manufacturing the package structure of the electronic device, before forming a seed layer for growing a subsequent metal layer on a surface formed with an insulating layer and the metal layer, surface treatment is performed on the surface formed with the insulating layer and the metal layer using a surface treatment device to remove residues on the surface and improve the adhesion of the seed layer to the surface. However, after performing the surface treatment on the surface, when waiting for the next process (such as forming the seed layer using a coating device) and exposing the surface to the atmospheric environment for a long time, defects (such as intrusion by water vapor) or oxides (such as metal layer oxidation) may, for example, be generated on the surface formed with the insulating layer and the metal layer, resulting in a decrease in the adhesion of the seed layer to the surface, that is, the effect of the surface treatment is reduced, and the reliability and/or the electrical properties of the electronic device including the package structure are reduced.

SUMMARY

The disclosure provides a manufacturing method of a package structure of an electronic device, and when the package structure manufactured by the same is applied in the electronic device, the electronic device can have improved reliability and/or electrical properties.

The manufacturing method of the package structure according to some embodiments of the disclosure includes the following steps. First, a first seed layer is formed on a carrier plate. Next, a first metal layer is formed on the first seed layer. After that, a first insulating layer is formed on the first metal layer. The first insulating layer exposes a portion of the first metal layer. Next, a first plasma treatment is performed on the first insulating layer and the exposed portion of the first metal layer. Then, after performing the first plasma treatment, the carrier plate formed with the first seed layer, the first metal layer, and the first insulating layer is placed in a microenvironment controlling box. Then, after taking the carrier plate out of the microenvironment controlling box, a second seed layer is formed on the first insulating layer and the exposed portion of the first metal layer.

In order for the features and advantages of the disclosure to be more comprehensible, the following specific embodiments are described in detail in conjunction with the drawings.

BRIEF DESCRIPTION OF THE DRAWINGS

The drawings are included to provide a further understanding of the disclosure and are incorporated in and constitute a portion of the specification. The drawings illustrate embodiments of the disclosure and serve to explain principles of the disclosure together with the description.

DETAILED DESCRIPTION OF DISCLOSED EMBODIMENTS

Figure 1:
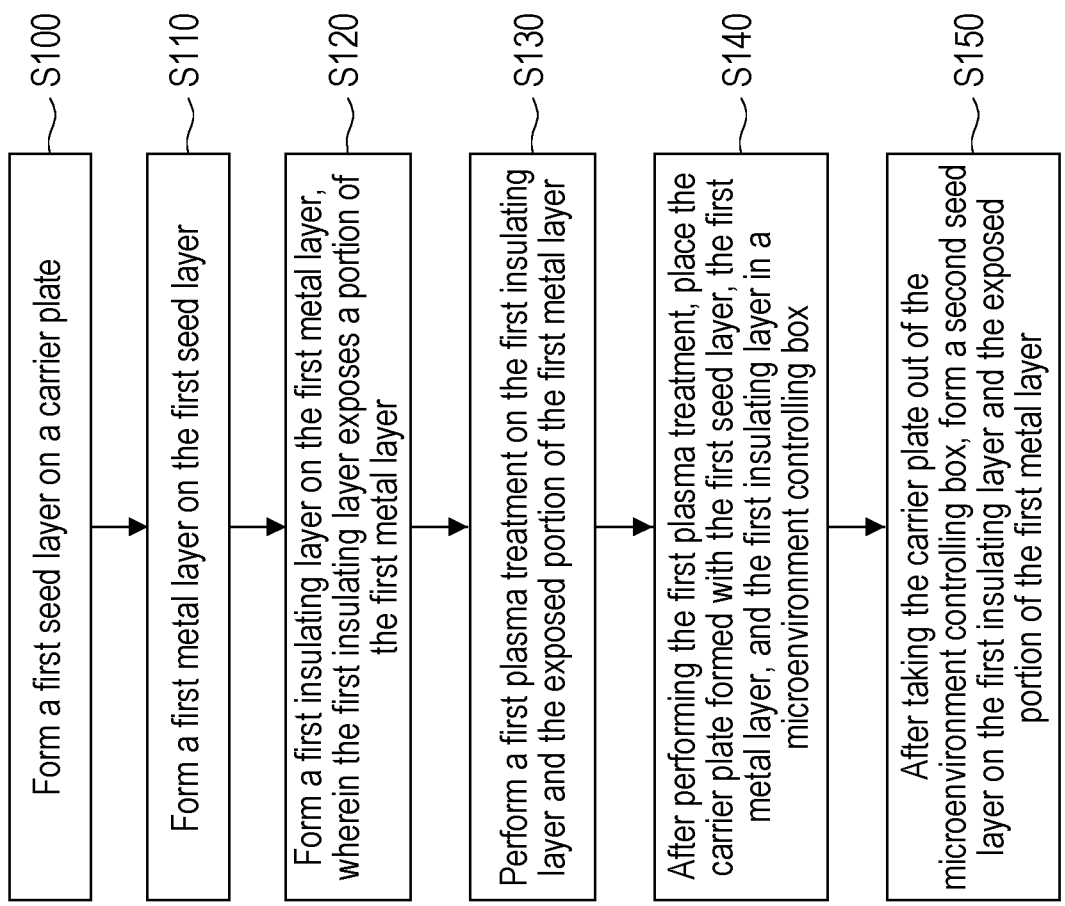
FIG. 1 is a flowchart of a manufacturing method of a package structure of an electronic device according to an embodiment of the disclosure.

The disclosure can be understood by referring to the following detailed description in conjunction with the drawings. It should be noted that in order to facilitate the understanding of the reader and the brevity of the drawings, multiple drawings in the disclosure only depict a part of an electronic device, and specific elements in the drawings are not drawn according to actual scale. In addition, the number and the size of each element in the drawings are for illustration only and are not intended to limit the scope of the disclosure.

Throughout the disclosure and the appended claims, certain terms may be used to refer to specific elements. It should be understood by persons skilled in the art that electronic device manufacturers may refer to the same element by different names. The disclosure does not intend to distinguish between elements with the same function but different names. In the following specification and claims, terms such as "including", "containing", and "having" are open-ended terms, so the terms should be interpreted as "containing but not limited to . . . ". Therefore, when the terms "including", "containing", and/or "having" are used in the description of the disclosure, the terms designate the presence of a corresponding feature, region, step, operation, and/or component, but do not exclude the presence of one or more corresponding features, regions, steps, operations, and/or components.

Directional terms, such as "upper", "lower", "front", "rear", "left", and "right", mentioned in the disclosure are only directions with reference to the drawings. Therefore, the used directional terms are used to illustrate, but not to limit, the disclosure. In the drawings, each drawing illustrates the general characteristics of a method, a structure, and/or a material used in a specific embodiment. However, the drawings should not be construed to define or limit the scope or nature covered by the embodiments. For example, for clarity, relative sizes, thicknesses, and positions of various film layers, regions, and/or structures may be reduced or enlarged.

When a corresponding component (such as a film layer or a region) is referred to as being "on another component", the component may be directly on the other component or there may be another component between the two. On the other hand, when a component is referred to as being "directly on another component", there is no component between the two. Also, when a component is referred to as being "on another component", the two have a top-down relationship in the top view direction, and the component may be above or below the other component, and the top-down relationship depends on the orientation of the device.

The terms "about", "substantially", or "roughly" are generally interpreted as within 20% of a given value or range or interpreted as within 10%, 5%, 3%, 2%, 1%, or 0.5% of the given value or range.

Terms such as "first" and "second" used in the specification and the claims are used to modify elements, and the terms do not imply and represent that the element(s) have any previous ordinal numbers, nor do they represent the order of a certain element and another element or the order of a manufacturing method. The use of the ordinal numbers is only used to clearly distinguish between an element with a certain name and another element with the same name. The claims and the specification may not use the same terms, whereby a first component in the specification may be a second component in the claims.

It should be noted that in the following embodiments, features in several different embodiments may be replaced, recombined, and mixed to complete other embodiments without departing from the spirit of the disclosure. As long as the features of the various embodiments do not violate the spirit of the invention or conflict with each other, the features can be mixed and matched arbitrarily.

Electrical connection or coupling described in the disclosure may refer to direct connection or indirect connection. In the case of direct connection, terminals of elements on two circuits are directly connected or connected to each other by a conductor segment. In the case of indirect connection, there is a switch, a diode, a capacitor, an inductor, a resistor, other suitable elements, or a combination of the above elements between the terminals of the elements on the two circuits, but not limited thereto.

In the disclosure, the measurement manner of thickness, length, and width may be by adopting an optical microscope, and the thickness may be measured by a cross-sectional image in an electron microscope, but not limited thereto. In addition, there may be a certain error in any two values or directions used for comparison. If a first value is equal to a second value, it implies that there may be an error of about 10% between the first value and the second value. If a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

The electronic device may have a composite layer circuit structure of the embodiment of the disclosure. The electronic device of the disclosure may include display, antenna (such as liquid crystal antenna), lighting, sensing, touch, splicing, other suitable functions, or a combination of the above functions, but not limited thereto. The electronic device includes a rollable or flexible electronic device, but not limited thereto. The electronic device may include, for example, liquid crystal, a light emitting diode (LED), a quantum dot (QD), fluorescence, phosphor, other suitable materials, or a combination thereof. The light emitting diode may include, for example, an organic light emitting diode (OLED), a micro LED, a mini LED, or a QLED (or QDLED), but not limited thereto. Hereinafter, the disclosure will be described by taking a display device or a splicing device as the electronic device, but the disclosure is not limited thereto. The electronic element may include a passive element and an active element, such as a capacitor, a resistor, an inductor, a diode, a transistor, a circuit board, a chip, a die, an integrated circuit (IC), a combination of the above elements, or other suitable electronic elements, but not limited thereto. The diode may include a light emitting diode or a photodiode. The light emitting diode may include, for example, an organic light emitting diode (OLED), a mini LED, a micro LED, or a quantum dot LED, but not limited thereto.

Exemplary embodiments of the disclosure are exemplified below, and the same reference numerals are used in the drawings and description to refer to the same or similar parts.

Figure 2:
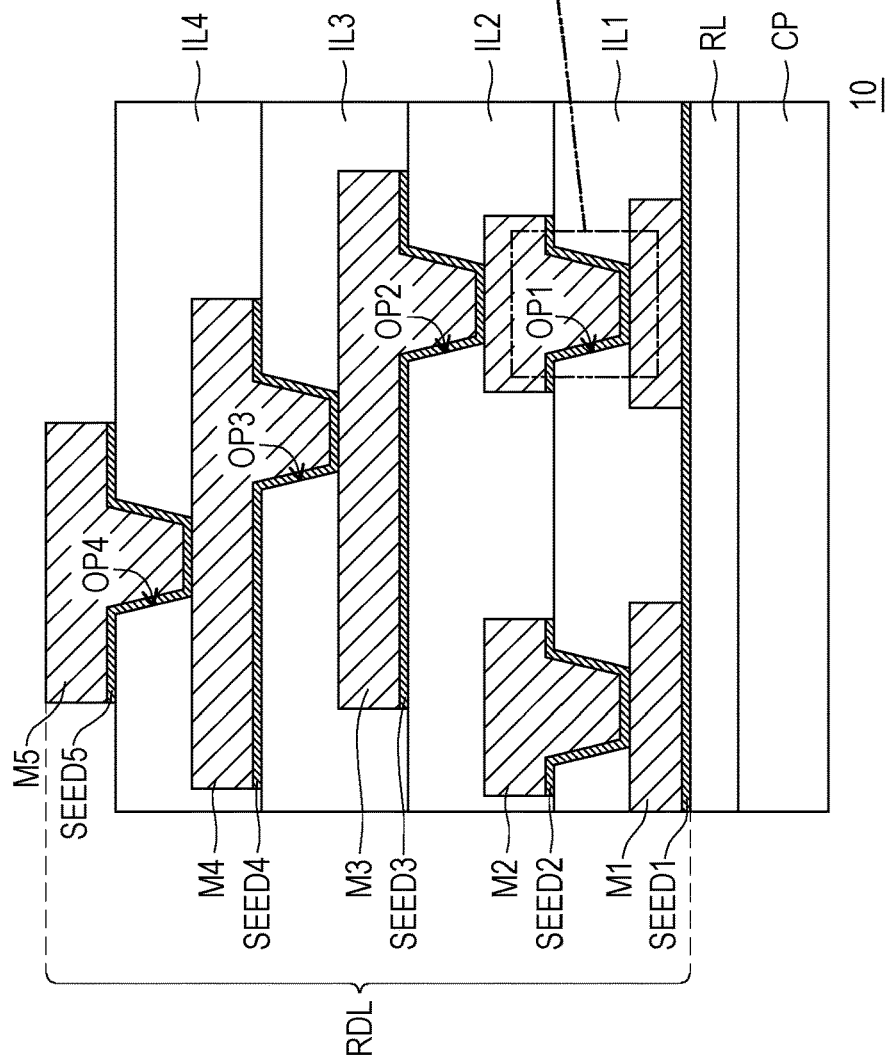
FIG. 2 is a schematic cross-sectional view of a package structure of an electronic device according to an embodiment of the disclosure.
Figure 3:
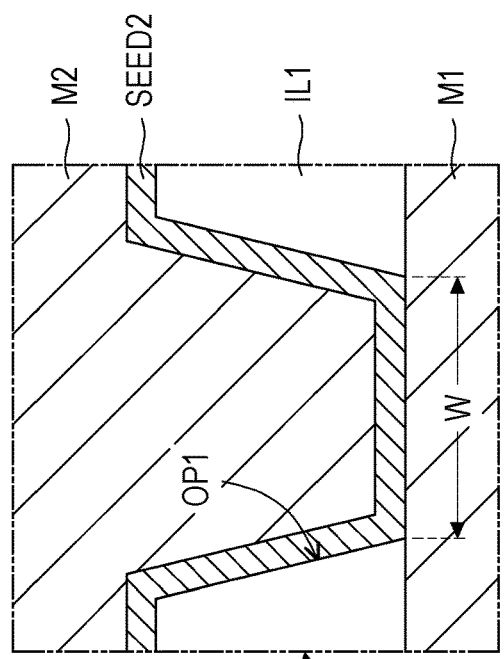
FIG. 3 is a partially enlarged cross-sectional schematic view of the package structure of the electronic device according to FIG. 2.
Figure 4:
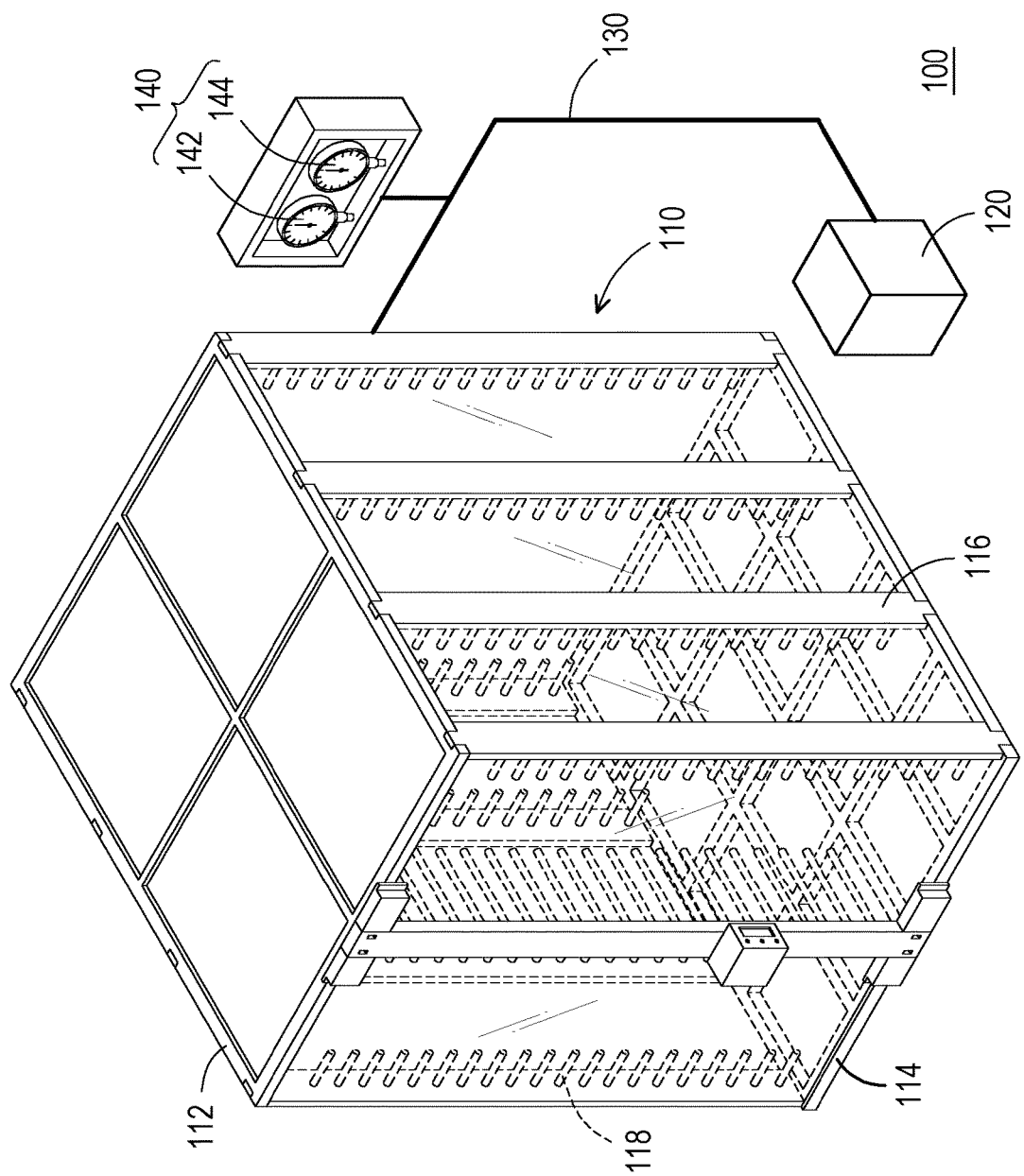
FIG. 4 is a schematic view of a microenvironment controlling device according to an embodiment of the disclosure.

FIG. 1 is a flowchart of a manufacturing method of a package structure of an electronic device according to an embodiment of the disclosure, FIG. 2 is a schematic cross-sectional view of a package structure of an electronic device according to an embodiment of the disclosure, FIG. 3 is a partially enlarged cross-sectional schematic view of the package structure of the electronic device according to FIG. 2, and FIG. 4 is a schematic view of a microenvironment controlling device according to an embodiment of the disclosure.

Please refer to FIG. 1 and FIG. 2 at the same time. In Step S100 of the embodiment, a first seed layer SEED1 is formed on a carrier plate CP. The material of the carrier plate CP may be, for example, an organic material or an inorganic material, such as glass, quartz, sapphire, silicon wafer, stainless steel, ceramics, polycarbonate (PC), polyimide (PI), polyethylene terephthalate (PET), a resin, an organosilicon compound, other suitable substrate materials, or a combination of the above. In the embodiment, the carrier plate CP includes a glass carrier plate, but the disclosure is not limited thereto. In addition, in the embodiment, before forming the first seed layer SEED1 on the carrier plate CP, a release layer RL may be first formed on the carrier plate CP. The configuration of the release layer RL enables a component subsequently disposed on the carrier plate CP to be easily separated therefrom. In some embodiments, the release layer RL has the characteristic of good heat resistance to withstand the subsequent heat treatment process. The material of the release layer RL may be, for example, a suitable organic material, and the disclosure is not limited thereto. In some embodiments, a top surface of the release layer RL (the surface away from the carrier plate CP) may be planarized to have a high degree of coplanarity. A forming method of the first seed layer SEED1 may be, for example, using a physical vapor deposition process or a chemical vapor deposition process, but the disclosure is not limited thereto. The material of the first seed layer SEED1 may be, for example, a metal, and may, for example, have a single-layer structure or a composite-layer structure with multiple sublayers formed of different metals, wherein the sublayers are stacked on each other. For example, the first seed layer SEED1 of the embodiment may include a titanium layer (not shown) and a copper layer (not shown) stacked on the titanium layer to have a composite layer structure, but the disclosure is not limited thereto.

In some embodiments, the carrier plate CP may have panel level dimensions. Based on this, the subsequent process to be performed in the embodiment may be, for example, to perform chip packaging after disposing a redistribution structure on the carrier plate CP with panel level dimensions; or a package that disposes a chip on the carrier plate CP with panel level dimensions. That is, the manufacturing method of the package structure shown in the embodiment may be used, for example, as a fan out panel level package (FOPLP) application, wherein the fan out panel level package may include a redistribution structure (RDL) first process or a chip first process. In the embodiment, the fan out panel level package can greatly improve the productivity compared to a wafer level package by adopting the carrier plate CP with panel level dimensions. At the same time, the carrier plate CP with panel level dimensions has a rectangular outline, which can also greatly improve the utilization rate of the carrier plate CP compared to the wafer level package. Therefore, the package structure of the electronic device manufactured according to the embodiment may be used to implement the requirement of high productivity.

In Step S110 of the embodiment, a first metal layer M1 is formed on the first seed layer SEED1. In the embodiment, forming the first metal layer M1 may include the following steps, but the disclosure is not limited thereto. A first mask layer (not shown) is formed on a surface of the first seed layer SEED1 away from the carrier plate CP, wherein the first mask layer may be formed by, for example, a spin coating process or other suitable processes followed by a patterning process, and the first mask layer includes multiple openings exposing a portion of the first seed layer SEED1. Next, in the openings, the first metal layer M1 is formed by growing the first seed layer SEED1 by, for example, an electroplating process. Based on this, the material of the first metal layer M1 may be, for example, the same as the material of the first seed layer SEED1. In the embodiment, the first metal layer M1 may be a copper layer, that is, the material of the first metal layer M1 includes copper. Afterwards, the first mask layer may be removed by, for example, an ashing process or other suitable peeling processes, but the disclosure is not limited thereto.

In Step S120 of the embodiment, a first insulating layer IL1 is formed on the first metal layer M1, wherein the first insulating layer IL1 exposes a portion of the first metal layer M1. In the embodiment, forming the first insulating layer IL1 may include the following steps, but the disclosure is not limited thereto. First, a first insulating material layer (not shown) covering the first metal layer M1 is formed on the surface of the first seed layer SEED1 away from the carrier plate CP, wherein the first insulating material layer may be formed by, for example, a chemical vapor deposition process or other suitable processes, and the disclosure is not limited thereto. Next, a patterning process is performed on the first insulating material layer to form the first insulating layer IL1 with multiple first openings OP1, wherein the first openings OP1 expose a portion of the first metal layer M1. The material of the first insulating layer IL1 may be, for example, an organic material, oxide, nitride, oxynitride, or a combination thereof, but the disclosure is not limited thereto. In the embodiment, the material of the first insulating layer IL1 includes photosensitive polyimide.

In Step S130 of the embodiment, a first plasma treatment is performed on the first insulating layer IL1 and the exposed portion of the first metal layer M1. In some embodiments, the first plasma treatment may be performed on the first insulating layer IL1 and the exposed portion of the first metal layer M1 using a surface treatment device in the prior art, but the disclosure is not limited thereto. Performing the first plasma treatment on the first insulating layer IL1 and the exposed portion of the first metal layer M1 may, for example, achieve the following effects. The roughness of the surface of the first insulating layer IL1 is increased and/or the degree of cross-linking of the material in the first insulating layer IL1 is increased; and/or native oxide formed on the first metal layer M1 is removed. That is, after performing the first plasma treatment on the surface of the first insulating layer IL1 and the surface of the exposed portion of the first metal layer M1, the adhesion of the seed layer to be subsequently formed to the surface can be improved. In some embodiments, a gas used in the first plasma treatment may include oxygen, hydrogen, argon, or a combination thereof, but the disclosure is not limited thereto.

In Step S140 of the embodiment, after performing the first plasma treatment, the carrier plate CP formed with the first seed layer SEED1, the first metal layer M1, and the first insulating layer IL1 is placed in a microenvironment controlling box 110. In an embodiment shown in FIG. 4, the microenvironment controlling box 110 is one of the components in a microenvironment controlling device 100, wherein the microenvironment controlling device 100 may include the microenvironment controlling box 110, a gas supplying device 120, a gas transmission pipeline 130, and a gas condition controlling device 140, but the disclosure is not limited thereto. The microenvironment controlling box 110 may include, for example, an upper bracket 112, a lower bracket 114, multiple pillars 116, and multiple rods 118, wherein the pillars 116 are disposed between the upper bracket 112 and the lower bracket 114 to constitute the main body of the microenvironment controlling box 110, the rods 118 are disposed at intervals on each pillar 116, and the extending directions of the rods 118 are perpendicular to the extending directions of the pillars 116 to, for example, carry the carrier plate CP, but the disclosure is not limited thereto. The gas supplying device 120 is loaded with, for example, nitrogen, clean dry air (CDA), or other suitable gas for supplying to the microenvironment controlling box 110. The gas transmission pipeline 130 is, for example, used to transmit gas loaded by the gas supplying device 120 to the microenvironment controlling box 110. The gas condition controlling device 140 is used to, for example, control the conditions of the gas transmitted to the microenvironment controlling box 110. In detail, in the embodiment, the gas condition controlling device 140 includes an oxygen condition controlling element 142 and a water vapor condition controlling element 144, wherein the oxygen condition controlling element 142 may control the concentration of the gas transmitted to the microenvironment controlling box 110, and the water vapor condition controlling element 144 may control the relative humidity of the gas transmitted to the microenvironment controlling box 110. In the embodiment, the oxygen concentration in the microenvironment controlling box 110 is less than 1000 ppm, and the relative humidity in the microenvironment controlling box 110 is less than 50%. In addition, in some embodiments, the temperature in the microenvironment controlling box 110 is greater than or equal to 25° C. and less than or equal to 30° C., the air pressure in the microenvironment controlling box 110 is greater than 1 atm, and the gas in the microenvironment controlling box 110 may include nitrogen or clean dry air (transmitted by the gas supplying device 120). Based on this, after placing the carrier plate CP formed with the first seed layer SEED1, the first metal layer M1, and the first insulating layer IL1 in the microenvironment controlling box 110, since the content of oxygen and water vapor in the microenvironment controlling box 110 is significantly less than the content of oxygen and water vapor in the atmospheric environment, the surface of the exposed portion of the first metal layer M1 may not be quickly oxidized and/or the rough surface of the first insulating layer IL1 may not be permeated by a large amount of water vapor, so that a second seed layer SEED2 to be subsequently formed may be firmly formed and attached on the surface of the exposed portion of the first metal layer M1 and the surface of the first insulating layer ILL that is, the adhesion of the second seed layer SEED2 to the surface of the portion of the first metal layer M1 and the first insulating layer IL1 can be increased. In addition, in some embodiments, before performing the first plasma treatment on the first insulating layer IL1 and the exposed portion of the first metal layer M1, the microenvironment controlling box 110 may also be used when the carrier plate CP is transported to the coating device to the surface treatment device. In some embodiments, the roughness of the surface of the first metal layer M1 is greater after the plasma treatment. In other words, the roughness of the surface of the first metal layer M1 after the plasma treatment may be greater than the roughness of the surface of the first metal layer M1 without the plasma treatment. In some embodiments, the roughness may be measured using an atomic force microscope (AFM) or other suitable measuring instrument. In addition, the "roughness" may be the arithmetic average roughness (Ra), that is, the arithmetic average of deviation values of the centerline distance from the profile along the length of the sampled portion, but the disclosure is not limited thereto.

In Step S150 of the embodiment, after taking the carrier plate CP out of the microenvironment controlling box 110, the second seed layer SEED2 is formed on the first insulating layer IL1 and the exposed portion of the first metal layer M1. For the step of forming the second seed layer SEED2, reference may be made to Step S100 above, which will not be repeated. In addition, after taking the carrier plate CP out of the microenvironment controlling box 110, the carrier plate CP may be selectively placed in the atmospheric environment for the subsequent process, but only for a short time, so that the surfaces of the first metal layer M1 and the first insulating layer IL1 located on the carrier plate CP may not be affected. In addition, the disclosure does not need to intentionally link the surface treatment device and the coating device, which improves the process efficiency of manufacturing the package structure of the electronic device.

In the embodiment, at least one cycle of the above steps of forming the metal layer and the insulating layer may be repeated to form the redistribution structure RDL shown in FIG. 2, wherein the redistribution structure RDL may be used as a distribution layer of the electronic device to provide the required conductive transmission path. For example, as shown in FIG. 2, the redistribution structure RDL may include the first seed layer SEED1, the first metal layer M1, the first insulating layer IL1 with the first openings OP1, the second seed layer SEED2, a second metal layer M2, a second insulating layer IL2 with multiple second openings OP2, a third seed layer SEED3, a third metal layer M3, a third insulating layer IL3 with multiple third openings OP3, a fourth seed layer SEED4, a fourth metal layer M4, an insulating layer IL4 with multiple fourth openings OP4, a fifth seed layer SEED5, and a fifth metal layer M5, but the disclosure is not limited thereto. In detail, after forming the second seed layer SEED2 on the first insulating layer IL1 and the exposed portion of the first metal layer M1 (Step S150), at least one cycle of the following steps may be, for example, sequentially performed. First, the second metal layer M2 is formed on the second seed layer SEED2, and reference may be made to Step S110 of the above embodiment for the step. In addition, during the process of forming the second metal layer M2, a portion of the second seed layer SEED2 is removed together. Next, the second insulating layer IL2 is formed on the second metal layer M2, wherein the second insulating layer IL2 exposes a portion of the second metal layer M2, and reference may be made Step S120 of the above embodiment for the step. Afterwards, a second plasma treatment is performed on the second insulating layer IL2 and the exposed portion of the second metal layer M2, and reference may be made to Step S130 of the above embodiment for the step. Next, after performing the second plasma treatment, the carrier plate CP formed with the first seed layer SEED1, the first metal layer M1, the first insulating layer IL1, the second seed layer SEED2, the second metal layer M2, and the second insulating layer IL2 is placed in the microenvironment controlling box 110, and reference may be made to Step S140 of the above embodiment for the step. Then, after taking the carrier plate CP out of the microenvironment controlling box 110, the third seed layer SEED3 is formed on the second insulating layer IL2 and the exposed portion of the second metal layer M2, and reference may be made to Step S150 of the above embodiment for the step.

In some embodiments, as shown in FIG. 3, the first opening OP1 may have a width W in a direction perpendicular to the normal direction of the carrier plate CP, wherein the width W may be greater than or equal to 10 microns and less than or equal to 20 microns, so that the impedance of the second seed layer SEED2 and the second metal layer M2 formed in the first opening OP1 may be less than or equal to 0.05 ohms, but the disclosure is not limited thereto. In addition, the second opening OP2, the third opening OP3, and the fourth opening OP4 may also have the width W greater than or equal to 10 microns and less than or equal to 20 microns, but the disclosure is not limited thereto.

So far, the fabrication of the package structure 10 of the embodiment of the disclosure is completed. It should be noted that although the manufacturing method of the package structure 10 of the embodiment is described by taking the above method as an example, the forming method of the package structure of the disclosure is not limited thereto. For example, after forming the redistribution structure RDL, the process of forming a semiconductor chip may be continued, that is, the manufacturing method of the package structure 10 of the embodiment is a redistribution structure (RDL) first process. In addition, although the package structure 10 of the embodiment of the disclosure is applied in the panel level package as an example, the package structure 10 of the disclosure may be applied to various semiconductor devices and/or semiconductor manufacturing processes, and the disclosure is not limited thereto. In addition, the package structure 10 of the embodiment of the disclosure may be bonded to an electronic element, such as an integrated circuit chip and/or a printed circuit board in the subsequent process, but the disclosure is not limited thereto. The bonding manner may be, for example, through disposing a bonding pad between the redistribution structure RDL and the electronic element, but the disclosure is not limited thereto.

In summary, in the manufacturing method of the package structure according to some embodiments of the disclosure, after performing the plasma treatment on the insulating layer and the exposed metal layer disposed on the carrier plate and before forming the subsequent seed layer on the carrier plate, the carrier plate including the metal layer and the insulating layer formed in the previous process is placed in the microenvironment controlling box, so that the adhesion of the subsequently formed seed layer to the surface of the metal layer and the surface of the insulating layer located on the carrier plate is increased, and the reliability and/or the electrical properties of the electronic device including the package structure is further improved. Furthermore, the surface treatment device and the coating device used in the manufacturing method of the package structure of the disclosure do not need to be linked, that is, the plasma treatment process and a film formation process can be performed using independent surface treatment device and coating device, which can improve the process efficiency of manufacturing the package structure of the electronic device of the disclosure.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments can still be modified or some or all of the technical features thereof can be equivalently replaced. However, the modifications or replacements do not cause the essence of the corresponding technical solutions to deviate from the scope of the technical solutions of the embodiments of the disclosure. As long as the features of various embodiments do not violate the spirit of the invention or conflict with each other, the features can be mixed and matched arbitrarily.

What is claimed is:

1. A manufacturing method of a package structure of an electronic device, comprising:
   forming a first seed layer on a carrier plate;
   forming a first metal layer on the first seed layer;
   forming a first insulating layer on the first metal layer, wherein the first insulating layer exposes a portion of the first metal layer;
   performing a first plasma treatment on the first insulating layer and the exposed portion of the first metal layer;
   after performing the first plasma treatment, placing the carrier plate formed with the first seed layer, the first metal layer, and the first insulating layer in a microenvironment controlling box; and
   after taking the carrier plate out of the microenvironment controlling box, forming a second seed layer on the first insulating layer and the exposed portion of the first metal layer.

2. The manufacturing method of the package structure of the electronic device according to claim 1, wherein an oxygen concentration in the microenvironment controlling box is less than 1000 ppm.

3. The manufacturing method of the package structure of the electronic device according to claim 1, wherein a relative humidity in the microenvironment controlling box is less than 50%.

4. The manufacturing method of the package structure of the electronic device according to claim 1, wherein a temperature in the microenvironment controlling box is greater than or equal to 25° C. and less than or equal to 30° C.

5. The manufacturing method of the package structure of the electronic device according to claim 1, wherein an air pressure in the microenvironment controlling box is greater than 1 atm.

6. The manufacturing method of the package structure of the electronic device according to claim 1, wherein a gas in the microenvironment controlling box comprises nitrogen or clean dry air.

7. The manufacturing method of the package structure of the electronic device according to claim 1, wherein the microenvironment controlling box comprises an upper bracket, a lower bracket, a plurality of pillars, and a plurality of rods, wherein the pillars are disposed between the upper bracket and the lower bracket to constitute a main body of the microenvironment controlling box, the rods are disposed at intervals on each of the pillars, and extending directions of the rods are perpendicular to extending directions of the pillars.

8. The manufacturing method of the package structure of the electronic device according to claim 1, wherein the carrier plate comprises a glass carrier plate.

9. The manufacturing method of the package structure of the electronic device according to claim 1, wherein before forming the first seed layer on the carrier plate, a release layer is formed on the carrier plate.

10. The manufacturing method of the package structure of the electronic device according to claim 1, wherein a surface of the release layer away from the carrier plate is planarized.

11. The manufacturing method of the package structure of the electronic device according to claim 1, wherein a gas used in the first plasma treatment comprises oxygen, hydrogen, argon, or a combination thereof.

12. The manufacturing method of the package structure of the electronic device according to claim 1, wherein a roughness of a surface of the first metal layer after the first plasma treatment is greater than a roughness of a surface of the first metal layer without the first plasma treatment.

13. The manufacturing method of the package structure of the electronic device according to claim 1, wherein the first seed layer comprises a titanium layer and a copper layer stacked on the titanium layer.

14. The manufacturing method of the package structure of the electronic device according to claim 1, wherein the first metal layer comprises a copper layer.

15. The manufacturing method of the package structure of the electronic device according to claim 1, wherein the first insulating layer has a first opening, and the first opening exposes a portion of the first metal layer.

16. The manufacturing method of the package structure of the electronic device according to claim 14, wherein the first opening has a first width in a direction perpendicular to a normal direction of the carrier plate, wherein the first width is greater than or equal to 10 microns and less than or equal to 20 microns.

17. The manufacturing method of the package structure of the electronic device according to claim 1, wherein after forming the second seed layer on the first insulating layer and the exposed portion of the first metal layer, the manufacturing method further comprises:
   forming a second metal layer on the second seed layer;
   forming a second insulating layer on the second metal layer, wherein the second insulating layer exposes a portion of the second metal layer;
   performing a second plasma treatment on the second insulating layer and the exposed portion of the second metal layer;
   after performing the second plasma treatment, placing the carrier plate formed with the first seed layer, the first metal layer, the first insulating layer, the second seed layer, the second metal layer, and the second insulating layer in the microenvironment controlling box; and
   after taking the carrier plate out of the microenvironment controlling box, forming a third seed layer on the second insulating layer and the exposed portion of the second metal layer.

18. The manufacturing method of the package structure of the electronic device according to claim 17, wherein an impedance of the second seed layer and the second metal layer is less than or equal to 0.05 ohms.

19. The manufacturing method of the package structure of the electronic device according to claim 17, wherein the second insulating layer has a second opening, and the second opening exposes a portion of the second metal layer.

20. The manufacturing method of the package structure of the electronic device according to claim 19, wherein the second opening has a second width in a direction perpendicular to a normal direction of the carrier plate, wherein the second width is greater than or equal to 10 microns and less than or equal to 20 microns.

\* \* \* \* \*